United States Patent
Goto et al.

(10) Patent No.: US 7,425,781 B2
(45) Date of Patent: Sep. 16, 2008

(54) ELECTRIC POWER SWITCHING APPARATUS PROVIDING REDUCED DEGREE OF NOISE INTERFERENCE WITH RADIO COMMUNICATION

(75) Inventors: Shinya Goto, Gifu (JP); Koji Kawasaki, Anjo (JP)

(73) Assignees: Denso Corporation, Kariya (JP); Nippon Soken, Inc., Nishio (JP)

( * ) Notice: Subject to any disclaimer, the term of this patent is extended or adjusted under 35 U.S.C. 154(b) by 0 days.

(21) Appl. No.: 11/319,062

(22) Filed: Dec. 28, 2005

(65) Prior Publication Data

US 2006/0140286 A1    Jun. 29, 2006

(30) Foreign Application Priority Data

Dec. 28, 2004    (JP) .............................. 2004-380552

(51) Int. Cl.
*G05F 1/10* (2006.01)
(52) U.S. Cl. ..................................................... 307/139
(58) Field of Classification Search .................. 307/139
See application file for complete search history.

(56) References Cited

U.S. PATENT DOCUMENTS

| 5,131,073 | A | 7/1992 | Furuta et al. |
|---|---|---|---|
| 5,167,006 | A | 11/1992 | Furuta et al. |
| 5,185,851 | A | 2/1993 | Furuta et al. |
| 5,191,637 | A | 3/1993 | Furuta et al. |
| 5,324,991 | A | 6/1994 | Furuta et al. |
| 5,327,522 | A | 7/1994 | Furuta et al. |
| 5,333,241 | A | 7/1994 | Furuta et al. |
| 5,481,646 | A | 1/1996 | Furuta et al. |
| 5,504,838 | A | 4/1996 | Furuta et al. |
| 5,519,889 | A * | 5/1996 | Hipp ........................... 455/297 |
| 5,581,662 | A | 12/1996 | Furuta et al. |
| 5,619,617 | A | 4/1997 | Furuta et al. |
| 5,640,315 | A | 6/1997 | Hirano et al. |
| 5,659,339 | A | 8/1997 | Rindal et al. |
| 6,647,052 | B2 | 11/2003 | Hailey |
| 7,197,290 | B2 * | 3/2007 | Patel ........................... 455/296 |
| 2002/0149351 | A1 | 10/2002 | Kanekawa et al. |
| 2003/0026116 | A1 | 2/2003 | Ueki et al. |

FOREIGN PATENT DOCUMENTS

| JP | A-05-327427 | 12/1993 |
|---|---|---|
| JP | A-07-264849 | 10/1995 |
| JP | A 2002-335672 | 11/2002 |
| JP | A 2003-079135 | 3/2003 |
| JP | A 2003-88101 | 3/2003 |
| JP | A-2004-266780 | 9/2004 |

OTHER PUBLICATIONS

Japanese Office Action for Patent Application No. 2004-380552. May 2, 2008. pp. 1-2.

* cited by examiner

*Primary Examiner*—Michael J Sherry
*Assistant Examiner*—Adi Amrany
(74) *Attorney, Agent, or Firm*—Oliff & Berridge, PLC (57) ABSTRACT

In an electric power switching apparatus a control circuit generates a switching control signal, for controlling successive current switching operations, as a of succession of pulse period patterns with each pulse period pattern made up of one or more successive pulses each having an identical pulse period, and with successive pulse period patterns constituting the control signal having respectively different values of pulse period. The noise power of high-frequency components resulting from the current switching is thereby dispersed along the frequency spectrum, reducing resultant radio noise interference.

14 Claims, 6 Drawing Sheets

ELECTRIC POWER SWITCHING APPARATUS PROVIDING REDUCED DEGREE OF NOISE INTERFERENCE WITH RADIO COMMUNICATION

CROSS REFERENCE TO RELATED DOCUMENT

This application is based on and incorporates herein by reference Japanese Patent Application No. 2004-380552 filed on Dec. 28, 2004.

BACKGROUND OF THE INVENTION

1. Field of Application

The present invention relates to an electric power switching apparatus such as a DC-DC converter or DC-AC inverter, which performs periodic switching of high levels of current at a specific switching frequency.

2. Description of Related Art

With such an electric power switching apparatus, the output power contains various harmonic components at high frequencies that are respective integral multiples of the switching frequency. Some of these harmonic frequency components may fall within a frequency band of radio communication or radio broadcasting and so cause noise interference, so that it is necessary to provide a low-pass filter to exclude these frequency components from the output of the electric power switching apparatus.

In particular, the switching frequency of a DC-DC converter may have a value of approximately 100 kHz, and when such a DC-DC converter is mounted in a vehicle at a location relatively close to a radio of the vehicle, it has been necessary to utilize a large-scale filter in order to reduce the radio noise interference to a sufficient extent. However such a filter occupies a large amount of space, and is expensive to manufacture.

In various countries, respective values of transmission carrier frequency are allocated to different radio broadcasting stations with a fixed amount of separation between adjacent carrier frequencies, to ensure that there will be a specific frequency gap that separates respective transmission frequency bands of radio stations having adjacent values of carrier frequency (with each transmission frequency band extending on either side of the corresponding carrier frequency).

In the case of AM (amplitude modulation) radio broadcasting, a separation of 9 kHz is established in Japan, for example, while the separation is 10 kHz in the U.S.A. The respective transmission carrier frequencies allocated to various radio stations will be referred to in the following as allocated carrier frequencies. Methods have been proposed for reducing the above-described radio noise interference, based on using the frequency gaps between the transmission frequency bands of respective radio stations, for example in Japanese patent publication No. 2002-335672, and in Japanese patent publication No. 2003-88101. These methods attempt to ensure, as far as possible, that no high-frequency components of the switching frequency of the electric power switching apparatus will overlap with any of the transmission frequency bands used by AM radio stations.

However such methods necessarily involve close control of the switching frequency. The narrower the gap between the respective wavebands of frequency-adjacent radio stations, the greater becomes the requisite accuracy of frequency control. These frequency gaps are narrow, e.g., 9 kHz or 10 kHz as described above. Due to that fact, and due to the inevitable changes which occur in frequency-determining components as a result of ambient temperature variations, manufacturing variations, long-term changes in component characteristics, etc., it is difficult to implement such methods on a practical basis.

SUMMARY OF THE INVENTION

It is an objective of the present invention to overcome the above problems by providing an electric power switching apparatus whereby the extent of radio noise interference resulting from operation of an electric power switching apparatus can be substantially reduced, while relaxing the manufacturing requirements for the apparatus, and enabling a noise suppression filter of the apparatus to be made smaller in size and more inexpensive to manufacture.

To achieve the above objectives, according to a first aspect the invention provides an electric power switching apparatus comprising switching circuit means controllable for performing successive switching operations to intermittently interrupt a flow of DC current, and control circuit means for generating a series of pulses as a switching control signal for controlling the switching operations, with the apparatus being characterized in that the control circuit means generates the switching control signal as a series of successively different types of pulse period patterns that are selected from a plurality of pulse period patterns having respectively different values of pulse period.

The term "pulse period pattern" is used herein with the significance of a succession of one or more pulses each having an identical pulse period. A pulse period pattern having a single pulse consists of a successive combination of an interval of specific duration (i.e., the pulse width) in which the switching control signal is set at an active level, and a subsequent interval in which the switching control signal is at an inactive level. The pulse period of a pulse period pattern is the sum of the pulse width and the subsequent inactive interval duration (i.e., which continues until the leading edge of a succeeding pulse). In the case of a pulse period made up of a plurality of successive pulses, the pulse period of that pulse period pattern is defined as the interval from the leading edge of any pulse in that pulse period pattern to the leading edge of an immediately succeeding pulse.

Pulse period patterns that have respectively different values of pulse period will be referred to as respectively different types of pulse period pattern. A "sequence of pulse period patterns" is made up of a fixedly predetermined number of one or more successive pulse period patterns that are of respectively different type.

The inverse value of the pulse period of a pulse period pattern constitutes an instantaneous value of switching frequency (referred to in the following simply as a switching frequency value).

The expression "successively selected pulse period patterns of respectively different type", as used in the following description and in the appended claims, signifies that each selected pulse period pattern has a different value of pulse period from that of an immediately precedingly selected pulse period pattern.

With the first aspect of the invention set out above, successive current switching operations of the electric power switching apparatus occur with irregular periodicity. However since the pulse width, and hence the duty ratio of each pulse period pattern, is controlled based on the output voltage of the electric power switching apparatus, similar control can be achieved to that of a conventional type of electric power switching apparatus in which the pulse period is fixed. Due to the irregular periodicity, high-frequency components produced by the switching operations will be harmonics of a plurality of different switching frequencies, rather than being harmonics of a single fixed switching frequency. More specifically, successive falling edges of current pulses that are generated in the electric power switching apparatus will occur with irregular periodicity, as will also the rising edges of these current pulses. Hence, due to the successive variations of the pulse periods, the power spectrum of the high-frequency components that are generated by the current switching operations will be effectively dispersed along the frequency axis.

At a result, when the switching frequencies have harmonic frequencies that fall within a radio communication frequency band, such as an AM radio broadcasting waveband, the degree of radio noise interference that thereby affects a radio receiver installed near the electric power switching apparatus will be substantially reduced, since the noise power will not be concentrated at each of one or more specific frequencies within that broadcasting waveband, but will be dispersed throughout that waveband.

The performance requirements for the noise filter of the electric power switching apparatus can thereby be relaxed, so that the filter can be made smaller in size and more light in weight and can be manufactured at lower cost.

It should be noted that although the invention is described herein mainly with regard to reducing noise interference with reception of LW (long wave) or MW (medium wave) AM (amplitude modulation) radio broadcasts, the invention is not limited in scope to reduction of such radio noise interference, but can be applied to reduction of radio noise interference effects upon various other forms of radio communication, e.g., 2-way radio communication, etc.

Such a switching control signal may be generated by cyclically selecting a fixed sequence of respectively different types of pulse period pattern, and successively outputting the selected pulse period patterns.

Alternatively, the order of the pulse period patterns within the cyclically repeated sequence can be periodically varied, in accordance with a predetermined algorithm, to thereby further disperse the power spectrum of the high-frequency switching components generated by the electric power switching apparatus.

As a further alternative, the switching control signal may be generated by randomly selecting successive ones of a plurality of respectively different types of pulse period patterns, and successively outputting the selected pulse period patterns. This will ensure that the successively different types of pulse period pattern constituting the switching control signal occur in a substantially random manner, thereby further reducing the possibility that harmonics of the (instantaneous) switching frequencies corresponding to the different types of pulse period pattern will mutually coincide within a radio broadcasting waveband, and so enabling more effective radio noise interference prevention.

In the latter case, the control circuit means can be configured to inhibit the selection of the same pulse period pattern twice or more in succession, to thereby ensure that successive pulse period patterns constituting the switching control signal will be of respectively different types. This will further serve to ensure that the successively different types of pulse period pattern are randomly selected.

From another aspect, the plurality of respectively different types of pulse period patterns may be predetermined such that none of a plurality of switching frequencies that are respective inverse values of the pulse periods of the pulse period patterns will share a common multiple with any frequency that lies within one or more predetermined AM radio broadcasting wavebands, e.g., a MW (medium wave) and/or LW (long wave) waveband.

This serves to prevent increases in noise power at specific frequencies within the broadcasting waveband as a result of high-frequency components, by ensuring that harmonics of switching frequencies that originate from the respectively different types of pulse period pattern will be outside the predetermined broadcasting waveband(s).

It should be noted that the expression that two or more frequencies "do not coincide" as used herein signifies that the frequencies differ from one another by more than 1%.

From another aspect of the invention, the respectively different types of pulse period patterns are predetermined such that none of a plurality of switching frequencies that are respective inverse values of the pulse periods of the pulse period patterns has a harmonic frequency that shares a common multiple with any of a predetermined plurality of frequencies are respective allocated carrier frequencies for AM (amplitude modulation) radio broadcasting. This serves to reduce the extent to which the high-frequency components resulting from the current switching operations will actually interfere with radio reception, by preventing the noise resulting from these components from occurring at frequencies close to the carrier frequencies used by radio broadcasting stations.

Furthermore in that case, the plurality of respectively different types of pulse period patterns are preferably predetermined such that each of the harmonic frequencies (respectively originating from the different types of pulse period pattern) that lie within the broadcast waveband is located in a frequency gap between a lower sideband of a transmission frequency band corresponding to a first carrier frequency and an upper sideband of a transmission frequency band corresponding to a second carrier frequency, where the first and second carrier frequencies are adjacent values of carrier frequency within the broadcasting waveband.

The size of such a frequency gap between the transmission frequency bands corresponding to two adjacent allocated carrier frequencies is specified as 5% of the frequency difference between these carrier frequencies.

This further serves to reduce the degree of radio noise interference resulting from the high-frequency components of current switching, by ensuring that harmonics of the switching frequencies will not have values that are within a transmission frequency band used by a radio broadcasting station.

From another aspect, the respectively different types of pulse period patterns are predetermined such that each of respective harmonic frequencies of switching frequencies that are respective inverse values of the pulse periods of the pulse period patterns and are within an AM radio broadcasting waveband is located within a frequency gap between transmission frequency bands of respective AM radio stations, i.e., which are among those radio stations whose transmissions are actually capable of being received within a region where the electric power switching apparatus is located.

Those AM radio stations whose transmissions are actually capable of being received can be determined beforehand, e.g., by monitoring operations performed in a specific region, which may for example be an area in which a vehicle equipped with the electric power switching apparatus is to be operated. This may be done for a plurality of different regions, and information from a vehicle navigation system, for example, can subsequently be used to select the current area in which the electric power switching apparatus is located, so that those radio stations whose transmissions are actually capable of being received within that specific region can be determined. Such a system could also be used to detect a condition in which there is no radio station having a sufficient level of received signal strength for reception, at the current location.

Such a method has the advantage that in general there will be large frequency gaps between the transmission frequency bands of those AM radio stations whose transmissions are actually capable of being received. Hence, the performance requirements for the circuit components of the noise filter, for example, can be further relaxed, since there is a reduced extent to which radio noise interference resulting from high-frequency components of current switching will actually interfere with received broadcasts.

From another aspect, the respectively different types of pulse period pattern can be predetermined such that the switching frequencies that are respective inverse values of the pulse periods of the pulse period patterns are divided into:

(a) a first set of switching frequencies which share a common multiple and do not have harmonic frequencies that are within a predetermined AM radio broadcasting waveband, and (b) a second set switching frequencies which share a common multiple, and each have harmonic frequencies that are within the AM radio broadcasting waveband.

In that case, the switching control signal is produced as a cyclically repeated succession of:

(1) a sequence of pulse period patterns that is made up of pulse period patterns which result in harmonic frequencies that are within the first set described above, and (2) a sequence of pulse period patterns that is made up of pulse period patterns which result in harmonic frequencies that are within the second set described above.

Preferably, each sequence of the pulse period patterns corresponding to the first set is immediately preceded by and succeeded by respective pulse period patterns which correspond to the second set and which have respectively different pulse periods.

The pulse period patterns within each of the above sequences, and the order of these pulse period patterns within a sequence, are not necessarily fixed, but may be successively changed in accordance with a predetermined algorithm.

In that way, those pulse period patterns which may result in radio noise interference within the AM broadcasting waveband can be dispersed along the time axis, so that the resultant noise spectrum is dispersed along the frequency axis.

Preferably, the number of pulse period patterns in each sequence that corresponds to the first set of switching frequencies described above (i.e., which do not produce radio noise interference within the AM broadcasting waveband) is made greater than the number of pulse period patterns in each sequence that corresponds to the second set of switching frequencies (i.e., which do produce radio noise interference).

From another aspect of the invention, when the control circuit means is supplied with an operating voltage from a power source that is itself an electric power switching apparatus, the respectively different types of pulse period pattern are preferably predetermined such that none of the switching frequencies that are respective inverse values of the pulse periods of the pulse period patterns share a common multiple with a switching frequency of the power source and with any frequency that is within a predetermined AM radio broadcasting waveband.

In that way it can be ensured that radio noise interference at frequencies within a specific AM radio broadcasting waveband resulting will not attain high levels of noise power at frequencies within that waveband as a result of mutual reinforcement of respective high-frequency components (at harmonic frequencies which lie within that AM waveband) generated by current switching operations of the two electric power switching apparatuses.

Similarly, if a second electric power switching apparatus (of conventional type, having a single switching frequency) is fixedly located in the vicinity of the electric power switching apparatus that is controlled in accordance with the present invention, the respectively different types of pulse period pattern are preferably predetermined such that none of the resultant switching frequencies share a common multiple with the switching frequency of the second electric power switching apparatus and with any frequency that is within a predetermined AM radio broadcasting waveband.

DESCRIPTION OF PREFERRED EMBODIMENTS

First Embodiment

Figure 1:
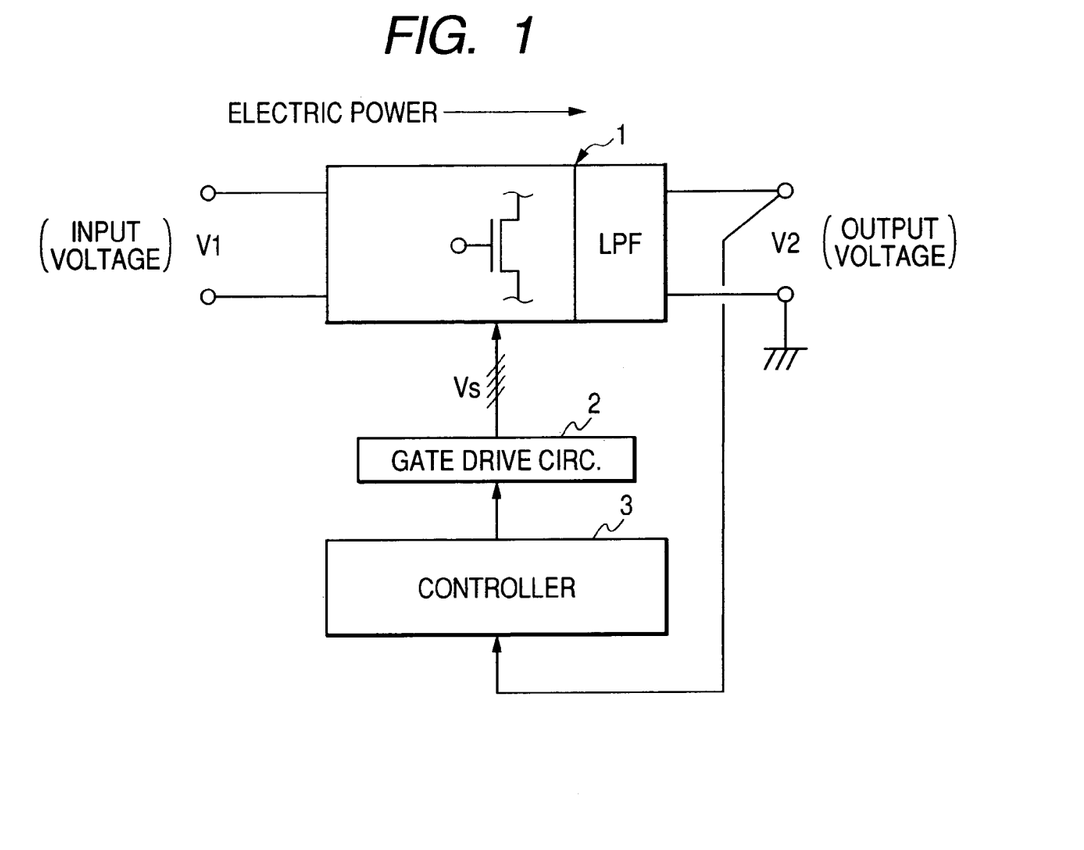
FIG. 1 is a circuit diagram of an embodiment of a DC-DC converter.

An embodiment of an electric power switching apparatus based on a DC-DC converter will be described referring first to the general system block diagram of FIG. 1. Here, numeral 1 denotes a DC-DC converter, which performs current switching to convert a DC input voltage V1 to an output DC voltage V2. A gate drive circuit 2 supplies a gate drive signal, as a switching control signal, to gate electrodes of field effect transistors (e.g., MOS FETs) which function as switching elements in the DC-DC converter 1. The gate drive signal is generated in response to a switching control signal that is generated by a controller 3, with the duty ratio of the switching control signal (and hence of the switching control signal from the gate drive circuit 2) being controlled by the controller 3 in accordance with the output voltage V2 of the DC-DC converter 1.

It will be assumed that this embodiment is designed for installation in a motor vehicle, with the input voltage V2 being the vehicle battery voltage. The DC-DC converter 1 incorporates a transformer (not shown in the drawings), which performs voltage step-up of AC power derived by successive switching of the input voltage V1, a rectifier circuit (not shown in the drawings) for rectifying the output voltage from the secondary winding of the transformer, and a low-pass filter (noise filter) for blocking high-frequency components contained in the rectified DC output voltage V2. Since such a type of switching circuit section of a DC-DC converter is well known, detailed description will be omitted. It should be noted that the invention is not limited to a DC-DC converter having any specific type of switching circuit section since, as is made clear in the following, the essential features of the invention reside in the manner in which the switching control signal is generated by the controller 3.

The gate drive circuit 2 serves to amplify the switching control signal from the controller 3, to produce the gate drive signal for driving the gate electrodes of the switching elements of the DC-DC converter 1. Since such a type of gate drive circuit is well known, detailed description is omitted.

The switching control signal produced from the controller 3 is a series of pulses whose respective pulse widths are determined based on monitoring the level of the output voltage V2, so that PWM (pulse width modulation) feedback control of V2 is implemented. This type of control of the output voltage of a DC-DC converter is well known, so that detailed description is omitted.

Radio Noise Reduction Control

The manner in which reduction of radio noise interference is achieved by the controller 3 of this embodiment will be described in the following. It will be assumed that the radio noise interference occurs in a predetermined AM (amplitude modulation) radio broadcasting waveband, as can occur when a radio receiver is installed in a vehicle together with a DC-DC converter (where the term "AM radio broadcasting waveband" is used in the following to signify a predetermined LW and/or MW AM radio broadcasting waveband). Essentially, the radio noise reduction control is based upon generating the switching control signal as a series of pulse period patterns having successively different pulse periods. The term "pulse period pattern", as described hereinabove, signifies a succession of one or more pulses each having an identical pulse period. A pulse period pattern having a single pulse consists of a successive combination of an interval in which the switching control signal is set at an active level (e.g., high level, commencing at the leading edge of a pulse) followed by an interval in which the switching control signal is at an inactive level (e.g., low level, commencing at the falling edge of the pulse). The pulse period of that pulse period pattern is the sum of the ON and OFF durations, i.e., the sum of the pulse width and the duration from the falling edge of the pulse until the leading edge of a succeeding pulse. The duty ratio of a pulse period pattern is the ratio of the pulse width to the pulse period.

The controller 3 generates the switching control signal by sequentially selecting pulse period patterns from a plurality of pulse period patterns having respectively different pulse periods, i.e., with the selected pulse period patterns being arrayed along the time axis to constitute the switching control signal. The pulse period patterns may be generated by software control, i.e., with the operation of the controller 3 being based on a suitably programmed microcomputer, which successively reads out stored data expressing a plurality of different pulse period values in a cyclically repeated sequence.

Figure 2:
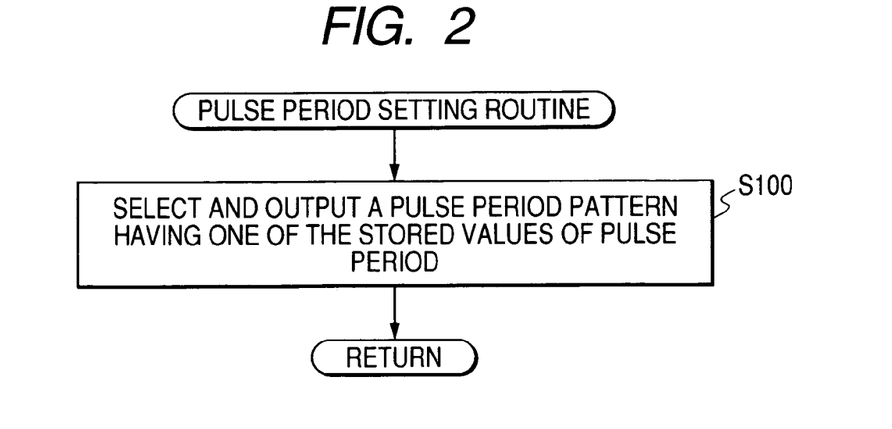
FIG. 2 is a flow diagram of an example of the operation of a controller in the embodiment, for the case of software implementation of the controller.
Figure 8:
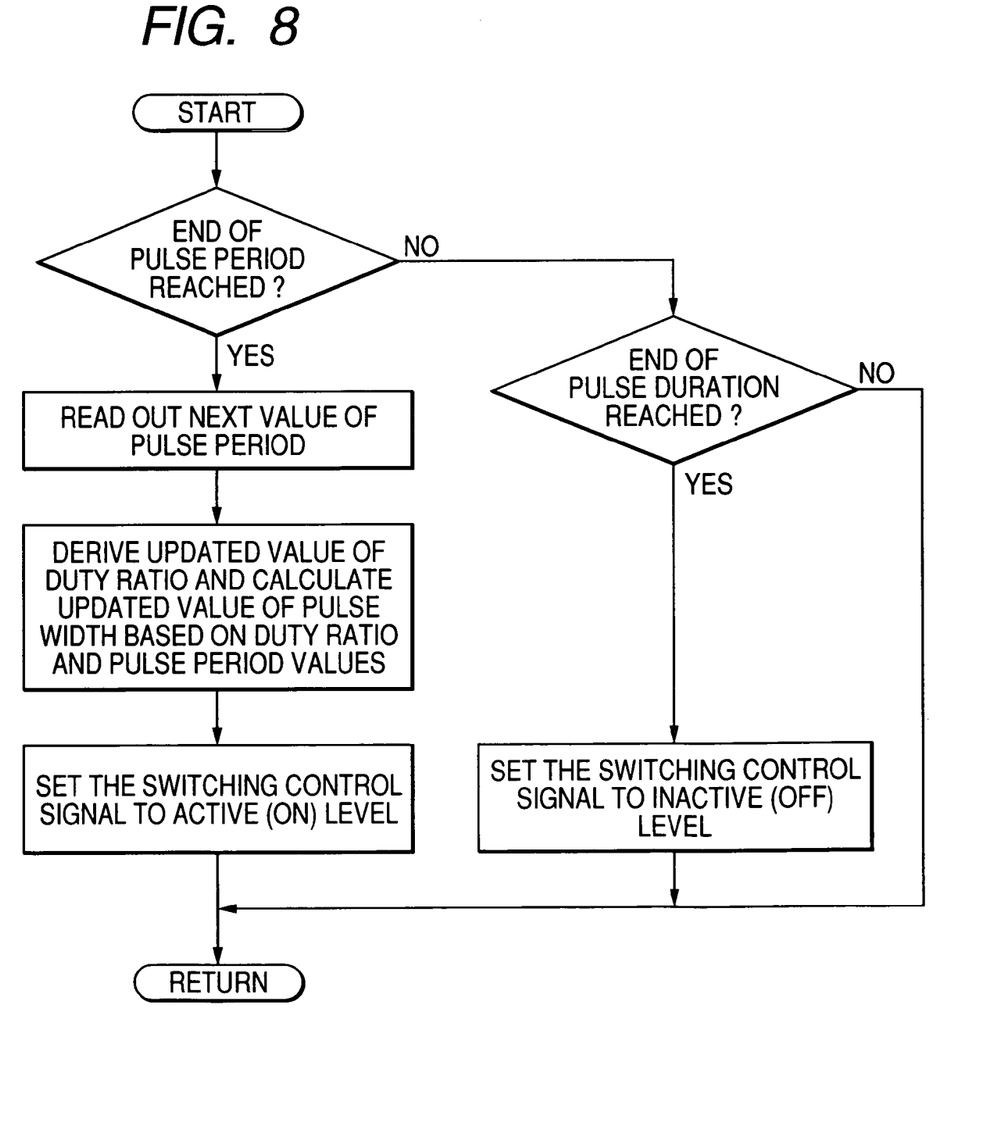
FIG. 8 is a flow diagram of an example of contents of a processing routine in FIG. 2.

This is illustrated by the flow diagram of FIG. 2, showing a processing routine that can be periodically executed by a microcomputer to implement the functions of the controller 3. Essentially in step S100 of FIG. 2, a decision is made as to whether is made as to whether a new pulse period pattern is to be generated as part of the switching control signal (i.e., a decision as to whether the end of a pulse period has been reached), and if so, a new value of pulse period is read out as part of the fixed sequence of respectively different values of pulse period, and a pulse of appropriate duration begins to be generated, i.e., the output from the controller 3 is set at an active level. FIG. 8 is a flow diagram of a specific example of the contents of step S100 of FIG. 2, for generating the switching control signal from the controller 3 in the form of successively different types of pulse period pattern. Since techniques are well known for adjusting the duty ratio of current switching in accordance with a deviation of an output voltage from a target value, detailed description of duty ratio control is omitted.

Figure 3:
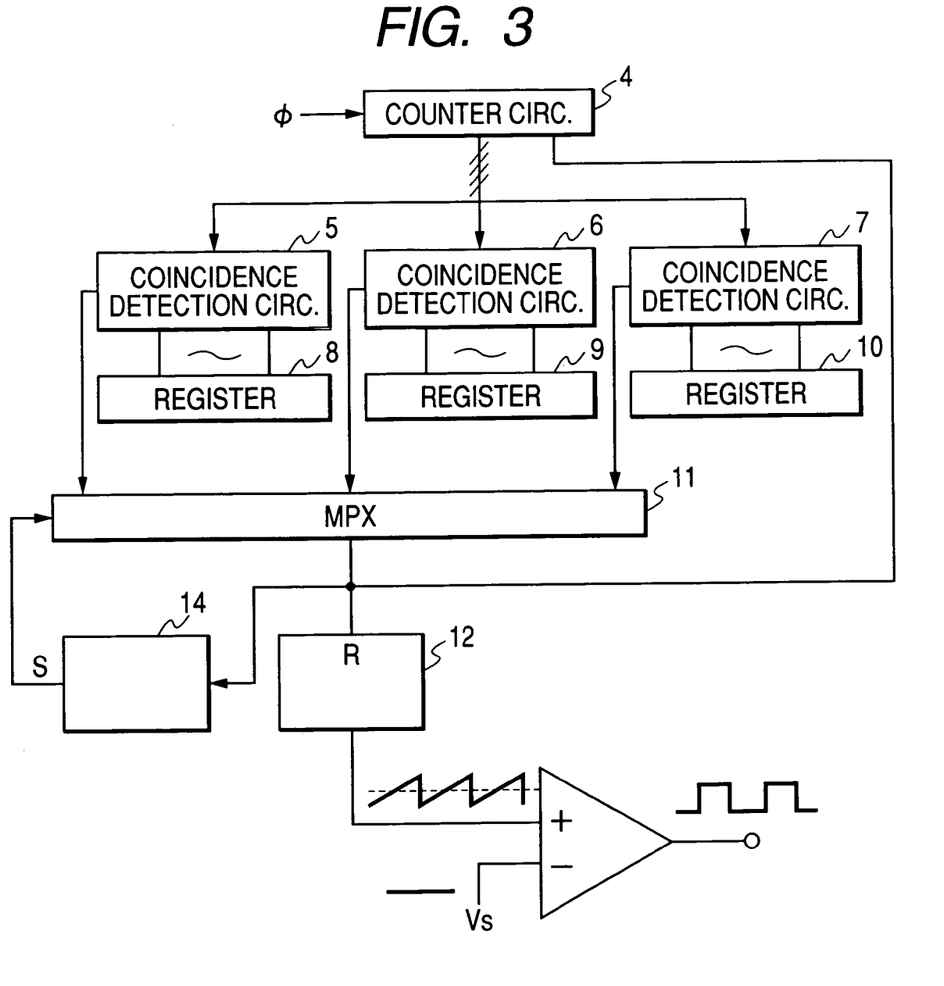
FIG. 3 is a circuit diagram of an example of the controller of the embodiment, for the case of hardware implementation of the controller.

Alternatively, the controller 3 could be implemented in hardware form, as illustrated by the circuit diagram of FIG. 3 for the case of a simple analog circuit configuration. This includes a set of three parallel coincidence detection circuits 5 to 7, each of which receives the count value of a counter 4, and a set of three registers 8 to 10 having respectively different values fixedly stored therein. The counter circuit 4 performs counting of a clock signal φ, and the parallel coincidence detection circuits 5 to 7 compare the current count value with the values held in the registers 3 to 10 respectively. When coincidence is detected by a parallel coincidence detection circuit, it outputs a corresponding coincidence signal to a multiplexer 11. When a coincidence signal is produced by one of the parallel coincidence detection circuits 5 to 7 and is selected by the multiplexer 11, it is supplied to a reset input terminal R of a sawtooth waveform signal generating circuit 12. A sawtooth-waveform output voltage that is produced by the sawtooth waveform signal generating circuit 12 is thereby reset to a low potential. The output voltage of the sawtooth waveform signal generating circuit 12 is applied to a non-inverting input terminal of a comparator 13, while an analog threshold voltage Vs is applied to the inverting input terminal of the comparator 13.

The comparator 13 thereby produces an output signal as a series of pulses whose respective durations are determined by the level of the analog threshold voltage Vs, with that output signal constituting the switching control signal produced by the controller 3.

Each time a coincidence signal is outputted from the multiplexer 11, it is applied to reset the counter circuit 4.

The multiplexer 11 is controlled by a selection control signal S that is produced from a pulse period changeover circuit 14, which receives each coincidence signal that is outputted from the multiplexer 11. The function of the pulse period changeover circuit 14 is to control the multiplexer 11 to successively select the respective outputs of the coincidence detection circuits 5, 6, 7 in a fixedly predetermined sequence that is cyclically repeated. Thus it is basically only necessary for the pulse period changeover circuit 14 to produce a selection control signal S which successively attains three different values (in the cyclically repeated sequence), in response to successive coincidence signals. The pulse period changeover circuit 14 can therefore be readily implemented as a combination of a shift register and decoder, counter and decoder, etc., so that detailed description is omitted.

Since respectively different data values are held in the registers 8, 9 and 10, the comparator 13 successively outputs respectively different types of pulse period pattern to constitute the switching control signal, in a cyclically repeated fixed sequence, with the pulse periods of the respectively different types of pulse period pattern being determined by the values stored in the registers 8, 9, 10.

With the circuit of FIG. 3, the average value of the respective duty ratios of successive pulse period patterns in the fixed sequence is adjusted in accordance with the analog threshold voltage Vs. However it would be equally possible to utilize a circuit whereby successively generated pulse period patterns have the same duty ratio (i.e., that is determined by a threshold voltage).

Figure 9:
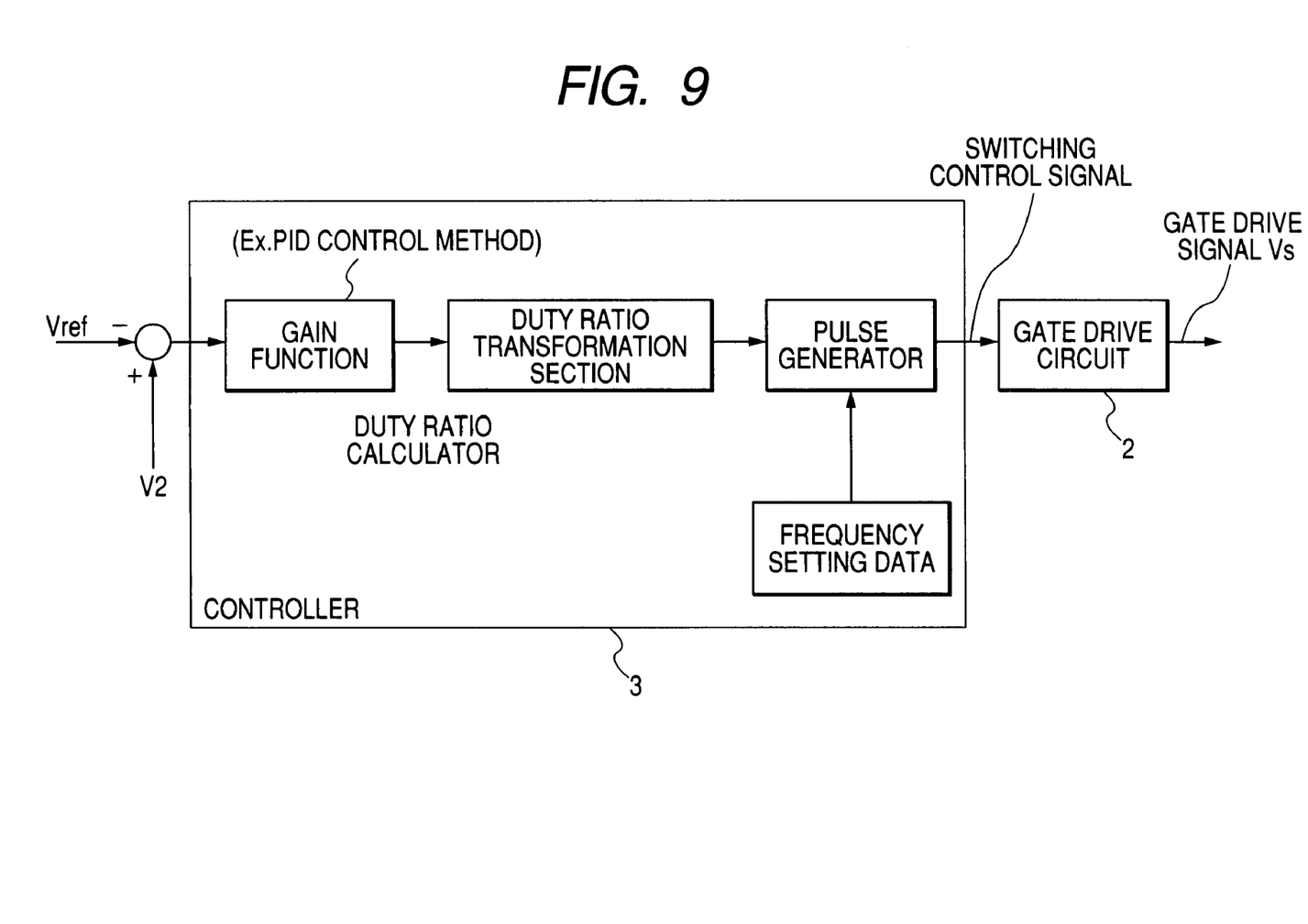
FIG. 9 is a system block diagram of an example of a digital type of hardware configuration of the controller.

Preferably, a dedicated hardware configuration for implementing the controller 3 would be of digital type, for example utilizing PID (proportional-integral-derivative) control. An example of such a configuration is shown in FIG. 9.

It can thus be understood that the controller 3 of this embodiment can be configured to function by software (i.e., programmed microcomputer) or dedicated hardware operation, to generate a switching control signal made up of successively different types of pulse period pattern, for controlling the DC-DC converter 1.

It will be apparent that various other arrangements for generating such a switching control signal based on software or hardware (or some combination of these) could readily be envisaged.

Figure 4:
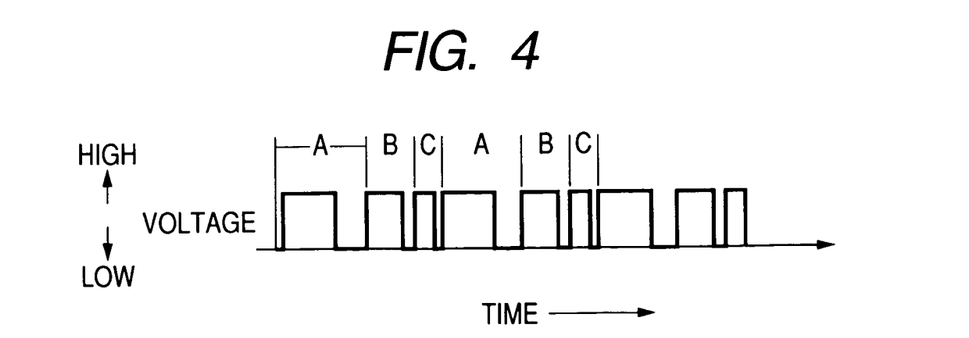
FIG. 4 is a diagram showing an example of a switching control signal produced by the controller of the embodiment.

An example of the switching control signal that is supplied from the controller 3 to the gate drive circuit 2 is shown in FIG. 4. This is made up of cyclic repetitions of a sequence of pulse period patterns respectively designated as A, B and C, having respectively different pulse periods. As a result of utilizing such a switching control signal, the high-frequency signal components that are generated by the operation of the DC-DC converter 1 are dispersed along the frequency spectrum. That is to say, each of these high-frequency signal components has a frequency that is an n-th order harmonic (where n is an integer of value 2 or more) of a frequency whose value is obtained as the inverse of a specific one of the various different pulse periods of the pulse period patterns (where "pulse period of a pulse period pattern" has the meaning defined hereinabove). The noise power of these harmonic frequency components is thereby dispersed throughout the frequency spectrum.

Figure 5:
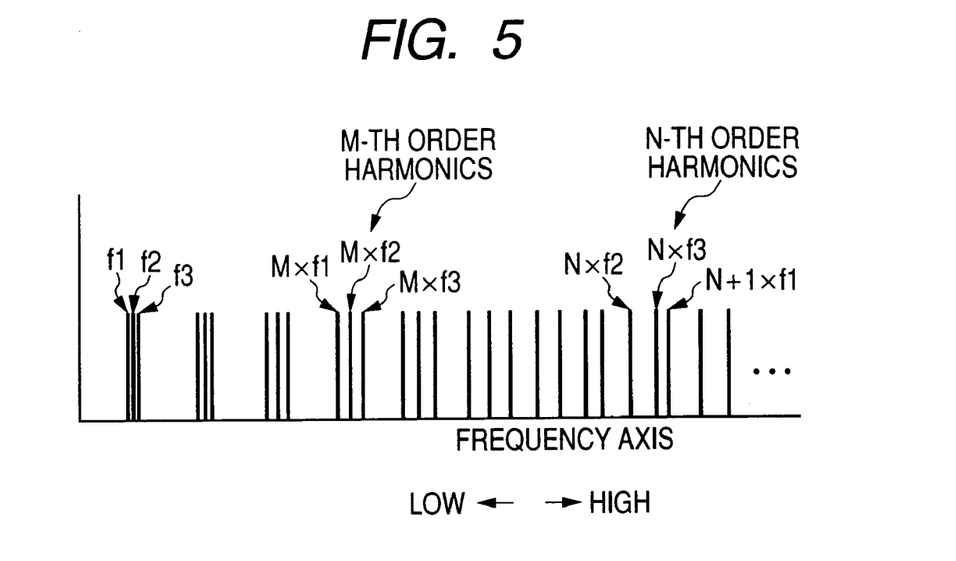
FIG. 5 is a diagram corresponding to FIG. 4, showing an example of the power spectrum of harmonic frequency components of the switching control signal.

This is illustrated in FIG. 5, showing the frequency values f1, f2 and f3 that are respective inverses of the pulse periods of the pulse period patterns A, B and C, and the corresponding harmonic frequencies of f1, f2, f3 such as the M-th order harmonics (M×f1), (M×f2) and (M×f3).

It can thus be ensured that the noise power of these harmonic frequency components cannot become concentrated at one or more specific frequency within an AM radio broadcasting waveband. Hence, the degree of radio noise interference that results from these high-frequency components of the switching frequency can be substantially reduced. The performance requirements for the noise filter (low-pass filter) of the DC-DC converter 1 can thereby be relaxed, so that the filter can be of smaller size and less expensive to manufacture.

In the above it has been assumed that each pulse period pattern contains only a single pulse. However it would be equally possible to generate each pulse period pattern as a plurality of successive pulses having a common pulse period. With the circuit of FIG. 3 for example, this can be accomplished by configuring the pulse period changeover circuit 14 to control the multiplexer 11 to select each of the respective outputs of the coincidence detection circuits 5, 6, 7 a plurality of times in succession.

The above has been described for the case in which the cyclically repeated sequence of respectively different types of pulse period pattern, used to constitute the switching control signal, is a fixed sequence. However it would be equally possible to configure the controller 3 to periodically alter the order of the pulse period patterns within that sequence, to more effectively distribute the power spectrum of the high-frequency switching components along the frequency axis.

Second Embodiment

With the first embodiment described above, the respectively different types of pulse period pattern are generated in a cyclically repeated fixed sequence. With a second embodiment, whose operation and configuration can be similar to that described for the first embodiment, the pulse period patterns are successively randomly selected to constitute the switching control signal, from among a plurality of respectively different values, e.g., which may be held stored in a memory that is accessed by a microcomputer in the case of software operation. In that case, the microcomputer would be controlled to randomly access successive memory locations, to read out the successive pulse period values, and use these to generate the switching control signal as a succession of respectively different types of pulse period pattern.

Similarly in the case of a hardware configuration such as that of FIG. 3, the multiplexer 11 could be controlled based on the output from a random number generator, to select the outputs from the coincidence detection circuits 5, 6, 7 in a randomly determined succession, to thereby produce successive pulse period patterns having randomly varying pulse periods from the comparator 13. It will be apparent that this could readily be implemented by a simple modification of the circuit of FIG. 3.

As a modified form of this embodiment, the operation of randomly selecting a pulse period pattern can be controlled such that the same pulse period pattern will not be utilized two or more times in succession, in producing the switching control signal. That is to say, if the same pulse period pattern is selected twice in succession, the random selection would then be repeated, to obtain a different pulse period pattern.

Third Embodiment

With a third embodiment, whose operation and configuration can be basically similar to that described for the first embodiment, the respectively different successive pulse period patterns that constitute the switching control signal produced by the controller 3 may be generated in a cyclically repetitive fixed sequence as with the first embodiment or as a random sequence as with the second embodiment. However with the third embodiment, only pulse period patterns having respective specific values of pulse period are utilized, e.g., as the pulse period patterns A, B, C shown in FIG. 4. These specific values of pulse period are predetermined such that none of the switching frequency harmonic components that are generated by the DC-DC converter 1 (each of which has a frequency that is a harmonic of a frequency value that is the inverse of a pulse period of a pulse period pattern) will fall within the AM radio broadcasting waveband (that is to say, such that none of the switching frequency harmonic components will fall within the predetermined AM radio broadcasting waveband).

The degree to which the switching frequency harmonic components produce radio noise interference can thereby be further reduced.

Fourth Embodiment

With a fourth embodiment, whose operation and configuration can be basically similar to that described for the first embodiment, the respectively different successive pulse period patterns that constitute the switching control signal produced by the controller 3 may be generated in a cyclically repetitive fixed sequence as with the first embodiment or as a random sequence as with the second embodiment. With the third embodiment, only pulse period patterns having respective specific values of pulse period are utilized, e.g., as the pulse period patterns A, B, C of FIG. 4. These specific values of pulse period are predetermined such that, of the switching frequency harmonic components that are generated by the DC-DC converter 1 (each of which has a frequency that is a harmonic of a frequency value that is the inverse of a pulse period of a pulse period pattern), two or more these harmonic components will not coincide in frequency, at a frequency that lies within the AM radio broadcasting waveband.

It can thereby be ensured that any high-frequency components of the switching frequencies that fall within the AM radio broadcasting waveband will not become mutually superimposed. Hence, the dispersion of the interference noise along the noise power spectrum can be more reliably achieved, resulting in a decrease of the level of audible noise produced by a radio receiver.

Fifth Embodiment

With a fifth embodiment, whose operation and configuration can be basically similar to that described for the first embodiment, the respectively different successive pulse period patterns that constitute the switching control signal produced by the controller 3 may be generated in a cyclically repetitive fixed sequence as with the first embodiment or as a random sequence as with the second embodiment. With the fifth embodiment, only pulse period patterns having respective specific values of pulse period are utilized, e.g., as the pulse period patterns A, B, C of FIG. 4. These specific values of pulse period are predetermined such that none of the switching frequency harmonic components that are generated by the DC-DC converter 1 (each of which has a frequency that is a harmonic of a frequency value that is the inverse of a pulse period of a pulse period pattern) will coincide with an allocated carrier frequency of any of a predetermined set of AM broadcasting radio stations. These radio stations may, for example, be predetermined as those whose broadcasts can be received in an area in which the electric power switching apparatus is to be utilized.

In that way, it can be ensured that none of the harmonic frequency components generated by the DC-DC converter 1 will be close to the carrier frequency of an AM radio station whose broadcasts will be received in the vicinity of the DC-DC converter 1 (i.e., with the minimum separation between these allocated carrier frequencies being 9 kHz or 10 kHz), so that the level of radio noise power at frequencies close to these broadcasting carrier frequencies can be reduced.

Sixth Embodiment

Figure 6:
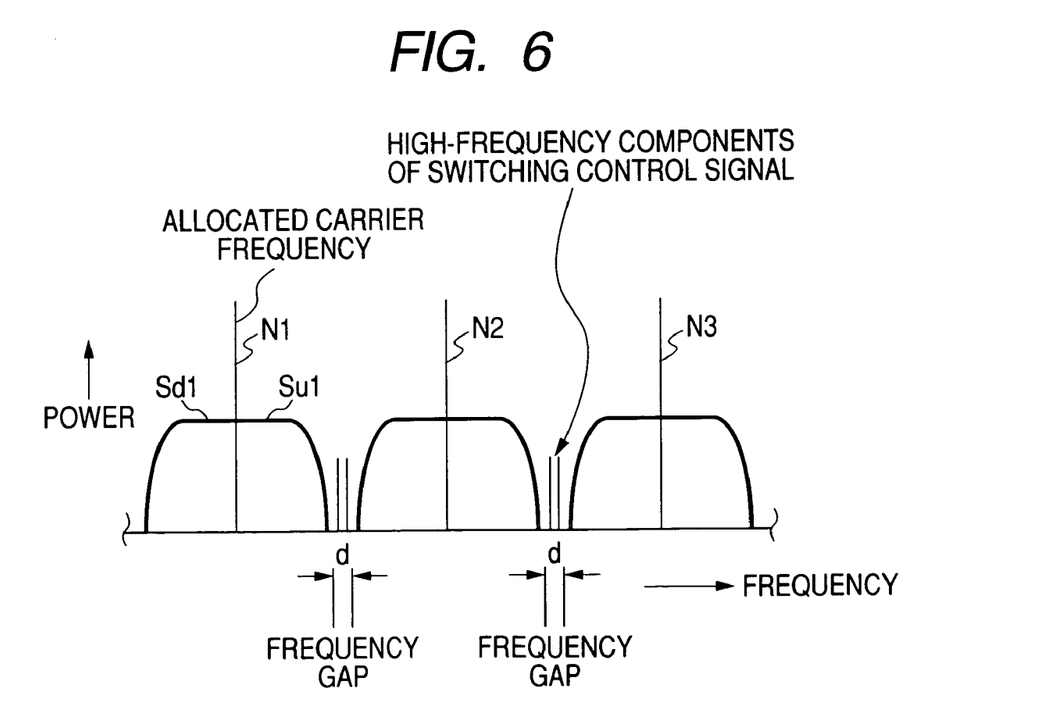
FIG. 6 is a diagram showing an example of a power spectrum of respective radio broadcasting station transmission bands in relation to harmonic frequency components of the switching control signal, with a modified form of the embodiment.

In addition to having respective allocated values of carrier frequency, the width of transmission frequency band used by each AM radio station is also specified, to ensure at least a minimum value of frequency gap between the respective transmission frequency bands. This is illustrated in FIG. 6, showing part of an AM broadcasting frequency spectrum, in which successively adjacent allocated carrier frequencies of respective radio stations are designated as N1, N2, N3, with a frequency gap Gd between the upper sideband portion and lower sideband portion of each pair of adjacent transmission frequency bands, such as the sideband portions Sd1, Su1 in FIG. 6.

With a sixth embodiment, whose operation and configuration can be basically similar to that described for the first embodiment, the respectively different types of pulse period pattern constituting the switching control signal produced by the controller 3 may be generated in a cyclically repetitive fixed sequence as with the first embodiment or as a random sequence as with the second embodiment. With the sixth embodiment, only pulse period patterns having respective specific values of pulse period are utilized, e.g., as the pulse period patterns A, B, C of FIG. 4. These specific values of pulse period are predetermined such that all of the switching frequency harmonic components that are generated by the DC-DC converter 1 (each of which has a frequency that is a harmonic of a frequency value that is the inverse of a pulse period of a pulse period pattern), and that fall within the AM radio broadcasting waveband, will be within one of the frequency gaps Gd between the transmission frequency bands used by radio stations which have adjacent values of carrier frequency, i.e., will be located between the upper sideband portion Su1 of the frequency band of one radio station and the lower sideband portion Sd1 of the frequency band of another (frequency-adjacent) radio station.

In that way, by reducing the extent to which the high-frequency harmonic components generated by the operation of the DC-DC converter 1 can actually affect any received AM radio broadcast, an effective lowering of radio noise interference can be achieved.

Seventh Embodiment

The seventh embodiment is a modified form of the sixth embodiment described above. With the seventh embodiment, the pulse periods of the respectively different types of pulse period pattern that constitute the switching control signal of the DC-DC converter 1 are predetermined such that each of the switching frequency harmonic components that are generated by the DC-DC converter 1 and that fall within the AM radio broadcasting waveband, will be within a frequency gap between respective transmission frequency bands used by radio stations that can actually be received by a radio receiver, e.g., that can be received by an AM radio receiver that is installed in a vehicle, close to the DC-DC converter 1.

The determination of the radio stations whose transmissions can actually be received can for example be based upon monitoring of the radio reception conditions within an area in which the DC-DC converter 1 is to be operated, prior to operation of the electric power switching apparatus.

In this case, in general, the frequency gaps into which the harmonic frequencies can be inserted will be substantially larger than the above-described frequency gaps between transmission frequency bands having adjacent values of carrier frequency. Hence, a high degree of reduction of radio noise interference can thereby be achieved, so that effective prevention can be achieved of audible interference with those AM radio broadcasts that can actually be received by a receiver which is located near the DC-DC converter 1, without requiring a high degree of accuracy for the pulse period values of the pulse period patterns, and even if the noise suppression effectiveness of the noise filter of the DC-DC converter 1 is reduced as a result of variations in the characteristics of component parts of the filter.

Eighth Embodiment

With this embodiment, assuming that nine different types of pulse period pattern respectively designated as A, B, C, D, E, F, G are utilized, these pulse period patterns are determined such that the frequency values that are the inverse values of respective pulse periods of these pulse period patterns consist of:

(1) frequencies corresponding to the pulse period patterns D, E, F and G, designated as fd, fe, ff, fg, which share a common multiple with each other and with one or more frequencies within a predetermined AM radio broadcasting waveband (and so have harmonics within that waveband), with such pulse period patterns being designated in the following as "common multiple" pulse period patterns, and (2) frequencies corresponding to the pulse period patterns A, B, C, designated as fa, fb, fc, which share a common multiple with each other but not with any frequency within the AM radio broadcasting waveband (and so do not have harmonics within that waveband), with such pulse period patterns being designated in the following as "non-common multiple" pulse period patterns.

Each sequence of the "non-common multiple" pulse period patterns pulse period patterns A, B, C, will be designated as a small cycle. With this embodiment, a sequence of one or more of the "common multiple" pulse period patterns D, E, F, G is inserted between each pair of successive occurrences of the small cycle, to constitute the switching control signal that is generated by the controller 3.

Figure 7:
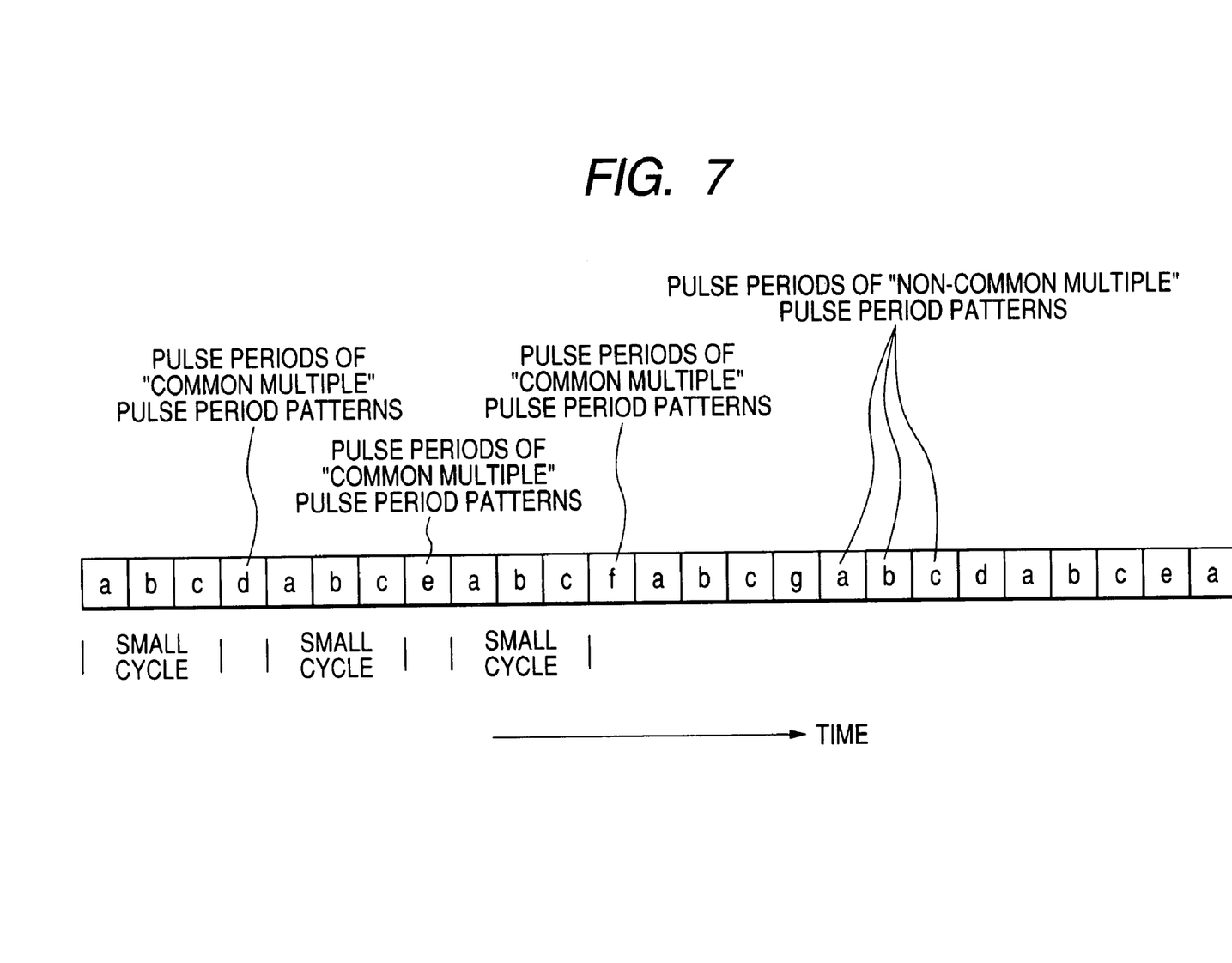
FIG. 7 is a diagram showing cyclically repeated pulse period pattern sequences that constitute the switching control signal, with another modified form of the embodiment.

The contents of each of these sequences and the order in which the pulse period patterns occur within a sequence may be fixed, or may be varied in accordance with a predetermined algorithm. However preferably, each such sequence of one or more of the "common multiple" pulse period patterns D, E, F, G is made up of a smaller number of pulse period patterns than the small cycle. This is illustrated in the example of FIG. 7, in which the order of pulse period patterns A, B, C within each small cycle is fixed, and the "common multiple" pulse period patterns D, E, F, G are inserted in succession, one at a time, between each pair of successive occurrences of the small cycle, to constitute the switching control signal. In that way, the level of noise that is introduced into the AM radio broadcasting band can be effectively reduced.

It will be understood that this embodiment is not limited to utilizing the above-described total number of pulse period patterns or numbers of pulse period patterns in the respective sequences.

Ninth Embodiment

The ninth embodiment, whose operation and configuration can be basically similar to that described for the first embodiment, is applicable to a condition in which an electric power switching apparatus other than the DC-DC converter 1 is fixedly installed near the DC-DC converter 1, e.g., within the same vehicle. With the ninth embodiment, the respectively different types of pulse period pattern constituting the switching control signal generated by the controller 3 are predetermined such that none of the switching frequencies corresponding to the pulse period patterns will share a common multiple with the switching frequency of the other electric power switching apparatus and with a frequency that is within a predetermined AM radio broadcasting waveband.

It can thereby be ensured that harmonic components that are respectively generated by the switching operation of the DC-DC converter 1 and of the other electric power switching apparatus will not become mutually superimposed within the AM radio broadcasting waveband, so that the AM radio reception noise levels can be reduced.

As an alternative form of the above embodiment, when the controller 3 is supplied with DC operating power from a power source which is itself an electric power switching apparatus, the respectively different types of pulse period pattern constituting the switching control signal generated by the controller 3 are predetermined such that none of the switching frequencies of the DC-DC converter 1 will share a common multiple with the switching frequency of the power source and with a frequency that is within the AM radio broadcasting waveband.

What is claimed is:

1. An electric power switching apparatus comprising switching circuit means controllable for performing successive switching operations to repetitively interrupt a flow of DC current, and control circuit means for generating a switching control signal for controlling said switching operations, wherein independent of a selected AM frequency, said control circuit means selects successive ones of a predetermined plurality of pulse period patterns having respectively different values of pulse period to generate said switching control signal as a series of said pulse period patterns, with successive pulse period patterns of said series having respectively different values of pulse period, and disperses a power spectrum of high-frequency harmonics of switching frequencies of said switching operations along the frequency axis within a radio broadcasting waveband; and said pulse period patterns having respectively different values of pulse period are predetermined such that none of a plurality of switching frequencies that are respective inverse values of pulse periods of said pulse period patterns shares a common multiple with any frequency that is within a predetermined AM (amplitude modulation) radio broadcasting waveband.

2. An electric power switching apparatus according to claim 1, wherein each of said pulse period patterns comprises a single pulse having a predetermined pulse period.

3. An electric power switching apparatus according to claim 1, wherein each of said pulse period patterns comprises a plurality of successively occurring pulses, having a predetermined common pulse period.

4. An electric power switching apparatus according to claim 1, wherein said control circuit means successively selects respective ones of said plurality of respectively different pulse period patterns in a cyclically repeated fixed sequence.

5. An electric power switching apparatus according to claim 1, wherein said control circuit means successively selects respective ones of said plurality of respectively different pulse period patterns in a random sequence.

6. An electric power switching apparatus according to claim 5, wherein said control circuit means inhibits selection of an identical pulse period pattern twice or more in succession.

7. An electric power switching apparatus according to claim 1, wherein said pulse period patterns having respectively different values of pulse period are predetermined such that respective harmonics of a plurality of switching frequencies that are respective inverse values of pulse periods of said pulse period patterns do not mutually coincide with any frequency that is an allocated carrier frequency for AM (amplitude modulation) radio broadcasting.

8. An electric power switching apparatus according to claim 7, wherein said pulse period patterns having different values of pulse period are predetermined such that any frequency value which coincides with a harmonic of one of said switching frequencies, is located within a frequency gap established between transmission frequency bands that respectively correspond to a pair of adjacent ones of said allocated carrier frequencies.

9. An electric power switching apparatus according to claim 1, wherein said pulse period patterns having different values of pulse period are predetermined such that each frequency which coincides with any harmonic frequency of the switching frequencies that are respective inverse values of pulse periods of said pulse period patterns, is located within a frequency gap between transmission frequency bands of respective AM radio stations whose transmissions have been determined beforehand as being currently capable of being received within a region where said electric power switching apparatus is located.

10. An electric power switching apparatus according to claim 1, wherein said pulse period patterns having respectively different values of pulse period are predetermined such that the switching frequencies that are respective inverse values of pulse periods of said pulse period patterns include a first set of switching frequencies, and do not include a second set of switching frequencies, wherein each of the second set of switching frequencies has harmonic frequencies within said AM radio broadcasting waveband, and wherein said switching control signal is produced as a successive alternation of a sequence of pulse period patterns that correspond to said first set of switching frequencies and a sequence of pulse period patterns that correspond to said second set of switching frequencies.

11. An electric power switching apparatus according to claim 10, wherein each of said sequences of pulse period patterns that correspond to said first set of switching frequencies is immediately preceded by a first pulse period pattern that corresponds to said second set of switching frequencies and is immediately succeeded by a second pulse period pattern that corresponds to said second set of switching frequencies, and wherein said first pulse period pattern and said second pulse period pattern have respectively different pulse periods.

12. An electric power switching apparatus according to claim 10, wherein a number of pulse period patterns in each of said sequences of pulse period patterns that correspond to said first set of switching frequencies is greater than a number of pulse period patterns constituting each of said sequences of pulse period patterns that correspond to said second set of switching frequencies.

13. An electric power switching apparatus according to claim 1, wherein said control circuit means is supplied with an operating voltage from a power source that is an electric power switching apparatus, and wherein said pulse period patterns having respectively different values of pulse period are predetermined such that switching frequencies that are respective inverse values of pulse periods of said pulse period patterns do not share a common multiple with a switching frequency of said power source.

14. An electric power switching apparatus according to claim 1, wherein a second electric power switching apparatus is fixedly located in a vicinity of said electric power switching apparatus, and wherein said pulse period patterns having respectively different values of pulse period are predetermined such that switching frequencies that are respective inverse values of pulse periods of said pulse period patterns do not share a common multiple with a switching frequency of said second electric power switching apparatus.

* * * * *